United States Patent
Sato et al.

(10) Patent No.: US 6,397,926 B1
(45) Date of Patent: Jun. 4, 2002

(54) HEAT SINK, METHOD MANUFACTURING THE SAME AND COOLING APPARATUS USING THE SAME

(75) Inventors: Kaoru Sato, Kumamoto; Yasuhiro Fujiwara, Fukuoka; Seiji Manabe, Fukuoka; Shinobu Kamizuru, Fukuoka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/501,765

(22) Filed: Feb. 10, 2000

(30) Foreign Application Priority Data

Jan. 26, 2000 (JP) .................................... 2000-016771

(51) Int. Cl.[7] .............................................. H05K 7/20
(52) U.S. Cl. ...................................... 165/80.3; 361/704
(58) Field of Search ............................. 165/80.3, 185; 361/704, 710; 257/722; 174/16.3

(56) References Cited

U.S. PATENT DOCUMENTS

| 4,369,838 A | * | 1/1983 | Asanuma et al. ........... 165/185 |
| 4,449,578 A | * | 5/1984 | Munekawa ............. 165/104.33 |
| 4,823,869 A | * | 4/1989 | Arnold et al. .............. 165/185 |
| 5,181,313 A | * | 1/1993 | Nonnemacher et al. ....... 29/620 |
| 5,598,322 A | * | 1/1997 | Von Arx et al. ............. 361/704 |
| 5,647,430 A | * | 7/1997 | Tajima ................... 165/104.33 |
| 5,775,418 A | * | 7/1998 | Lonergan et al. .......... 165/80.2 |

FOREIGN PATENT DOCUMENTS

| CA | 1026013 B1 | * | 2/1978 | ................. 257/722 |
| JP | 62-182600 | | 11/1987 | |
| JP | 5-218245 | | 8/1993 | |
| JP | 6-9144 | | 2/1994 | |

* cited by examiner

*Primary Examiner*—Allen Flanigan
(74) *Attorney, Agent, or Firm*—McDermott, Will & Emery

(57) ABSTRACT

A heatsink of the present invention has a column having a heat conducting plate with a heat receiving face contacting a heat producing element. On the side faces of the column are a plurality of first slits and a plurality of second slits disposed transversely to the plurality of first slits. These slits form a plurality of pillar-type protrusions functioning as fins for cooling. The depths of the first and second slits in the column are different, and this difference in levels are used to cause the fluid for cooling to form a turbulent flow. A cross section of the column tapers off gradually or in stages as the vertical distance increases from the heat receiving face. A cooling apparatus for the present invention includes a cooling means mounted on the heatsink of the present invention. The cooling apparatus for the present invention enjoys a high cooling ability and reduced size.

17 Claims, 17 Drawing Sheets

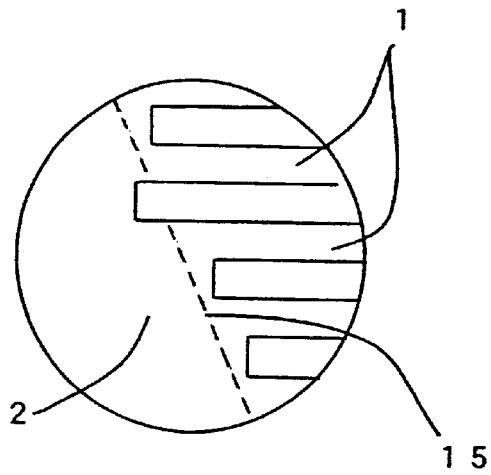
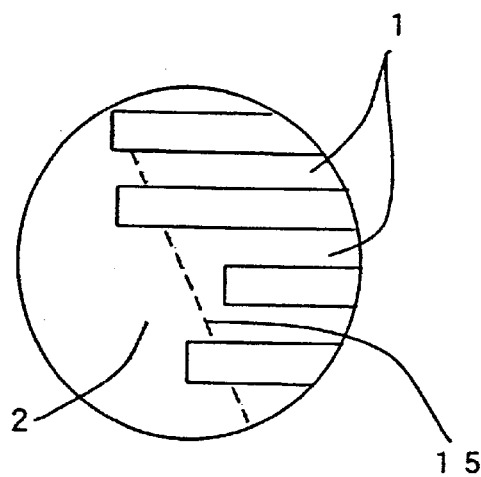
FIG. 17(a)          FIG. 17(b)
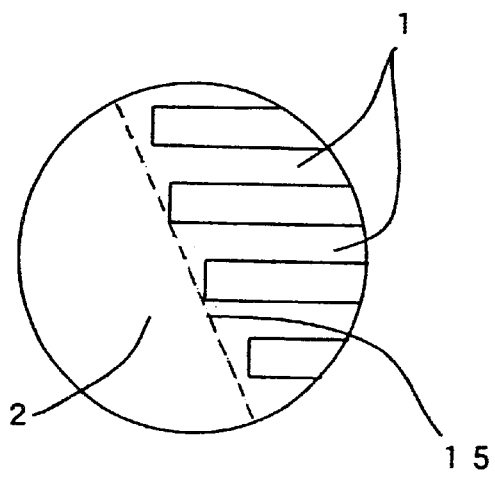
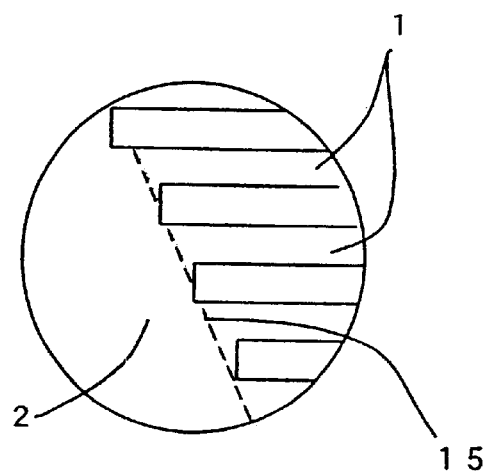
FIG. 17(c)          FIG. 17(d)

HEAT SINK, METHOD MANUFACTURING THE SAME AND COOLING APPARATUS USING THE SAME

FIELD OF THE INVENTION

The present invention relates generally to a heatsink which is used to cool heat producing elements such as integrated circuits (IC), central processing units (CPU), micro processing units (MPU) and other semiconductors and electronic components with heating sections. The present invention also relates to methods of manufacturing the heatsink, and to cooling apparatus using the heatsink combined with a cooling means such as a fan for cooling the heat producing elements.

BACKGROUND OF THE INVENTION

Integration of electronic components such as semiconductors and increasing frequency of operation clocks have been raising the heat produced by such components in recent years. Under such circumstances, maintaining temperatures at contact points of the electronic components within the operation temperature range has become a critical issue for the normal functioning of the electronic components. Increases in integration and frequency of the micro processing units (MPU) has been remarkable. Thus, dissipation of the heat produced by MPUs is particularly important for stabilizing their function and securing their operational longevity.

In general, heat produced by various electronic devices is dissipated by a heatsink which expands the heat dissipation area and effectively transfers heat to a refrigerant such as an air, and a cooling apparatus comprising a fan with a motor which forcibly blows air into the heatsink.

Heatsinks of the prior art are described below with accompanying FIGS. 14, 15 and 16.

FIG. 14 shows a perspective view of a construction of a conventional heatsink, FIG. 15, plan and side views of a construction of a conventional cooling apparatus, and FIG. 16, perspective and side views of a construction of another conventional heatsink.

These heatsinks can roughly be categorized into the following three types; a plate-type heatsink where a plurality of plate fins 1a made of many thin plates are disposed on a base plate 2b or a heat conduction section as shown in FIG. 14(a); a pin-type heatsink where many pin-type fins 1 are disposed on the plate 2b as shown in FIG. 14(b), and a tower-type heatsink where a plurality of plate fins 1c made of thin plates are disposed vertically to the axis of column 2 as shown in FIG. 16(a). These heatsinks are mainly constructed of materials with high heat conductivity such as aluminum and copper, and produced by the extrusion molding (otherwise called pultrusion molding) method, the cold forging method, the die casting method, or the thin plates accumulating method.

In the case of the pin-type heatsink, the heatsink is mounted either directly onto a heat producing element 3 as illustrated in FIG. 15(a), or indirectly by inserting a heat diffusion plate 2c between the heat producing element 3 and the heatsink to transfer the heat produced by the heat producing element 3 to the heatsink and to dissipate heat, and to protect the heat producing element, as illustrated in FIG. 15(b).

The cooling mechanism of the cooling apparatus in use, is described as follows: heat produced by the heat producing element 3 as shown in FIG. 15(b), is conducted to the pin-type fins 1 via the heat-conductive base plate 2b made of a highly heat conductive material such as aluminum, and, over the surface of the pin-type fins 1, convectively conducted to the air blown by a cooling fan 4 thus dissipated into the air and cooled. In order to improve the capacity of the cooling apparatus, heat is most desirably distributed throughout the heat conductive section evenly, and dissipated from all of the dissipation fins. However, in the case of the plate-type and pin-type heatsinks, heat emitted from the heat producing element tends to be conducted intensively to the heat dissipation fins disposed right above the heat producing element. It is relatively hard for the heat to be conducted to the peripheral heat dissipation fins. The reason for this is that the heat producing element is much smaller than the heat conducting section, thus contact area between them is very limited. Consequently, with the plate-type and the pin-type heatsinks, the heat dissipation fins as a whole often fail to function effectively.

It could be argued that if the amount of air flow around the heat dissipation fins is the same, the heat dissipating capacity can be increased by expanding the surface area by increasing the number of fins. In reality however, considering unit area, when the sectional area of the heat dissipation fins is increased, the area where air can flow into, such as an air flow area 7e (marked with diagonal lines in FIG. 15(a)) decreases, so does the total volume of air flow. Therefore, in some cases, the heat dissipation capacity lowers as a result. In other words, a mere increase in the number of dissipation fins does not bring about an improvement.

The most important aspect for the dissipation of heat is to effectively conduct heat produced by the heat producing element to the dissipation fins over the largest possible area. Considering this point, the tower-type heatsink shown in FIG. 16 has been introduced. In this kind of heatsink, heat produced in the heat producing element is conducted directly to the upper part of the heatsink by a central column, and spread flatly by the plate fins formed at a right angle to the axis of the column. The heat which has been spread flatly on the both faces of the thin plates is generally dissipated into the air by natural air cooling. In this tower-type heat sink, improvements have been proposed to increase the dissipation capacity. For example, Japanese Utility Model Application Unexamined Publication No. S62-182600 discloses a heatsink where through-hole vents are formed on the surface of the thin plates by cutting and folding the cut edges of the thin plates in the process of producing-the plate fins. Through these vents, air is permitted to convect more easily in the direction parallel to the axis of the column.

However, development of even faster electronic components such as semiconductors has resulted in a relative increase in the amount of heat produced. As a result, conventional cooling apparatus are now facing difficulties in cooling electronic components sufficiently, especially when it comes to electronic components such as MPU which produce significant amount of heat, the conventional cooling apparatus fail to reach their full capacity. In some cases, temperature rise in MPUs has led to thermal runaway and caused electronic apparatus to malfunction. To deal with increases in heat generation, it is possible to enhance the cooling capacity by making the cooling apparatus itself larger. However, the size of the electronic apparatus itself inevitably limits the size and weight of the cooling apparatus.

Compared with other types, the construction of the tower-type heatsink provides a better heat conductivity, however, it also tends to trap air. Furthermore, it is difficult to dispose a cooling fan on the top of the tower-type heatsink, therefore, the cooling fan must be disposed on a side face of the heatsink. However, if the cooling fan is disposed in such a manner, the heatsink is required to be as high as the width of the cooling fan. Thus, the cooling apparatus as a whole becomes remarkably large. Despite its size, however, the dissipation efficiency can not be improved satisfactorily.

The present invention aims to address the foregoing problems, and to provide a compact and highly efficient heatsink and a small cooling apparatus with high cooling ability using the heatsink. The present invention further aims at providing a method of manufacturing the heatsink which achieves the production of a highly effective heatsink in a productive and inexpensive manner.

SUMMARY OF THE INVENTION

A heatsink of the present invention has a column having a heat conducting plate with a heat receiving face in contact with a heat producing element. On the side faces of the column are a plurality of first slits disposed parallel to the heat receiving face and a plurality of second slits disposed transversely to the first slits. These slits form a plurality of pillar-type protrusions functioning as cooling fins. The first and the second slits on the side faces of the column are of different depth. Hereinafter, the pillar-type protrusions are called fins.

The sectional area of the column of the heatsink of the present invention tapers off toward both ends gradually or in stages from the vicinity of where the heat producing element is mounted.

The width of the second slits on the side of the column is wider at both ends than at the center of the heatsink or in the vicinity of the heat producing element.

The central line of the heat receiving face and that of the column are not aligned.

The heatsink of the present invention is compact, yet it has high heat dissipation properties and can effectively lead the heat produced by the heat producing element throughout the heatsink.

The manufacturing method of the heatsink of the present invention includes first and second processes. In the first process, the first slits are formed by providing a plurality of plate fins on the column and its longitudinal directions. Methods for providing the metallic plate include the extrusion molding using a metallic mold. In the second process, the second slits are formed in a direction approximately transverse to the longitudinal direction of the-plate fins. In other words, in the manufacturing method of the heatsink of the present invention, the pillar-type protrusions are produced by the two processes to form slits, and are used as cooling fins. The pillar-type protrusions are described as fins hereinafter.

This manufacturing method achieves productive and inexpensive production of high-performance heatsinks.

The cooling apparatus of the present invention includes a cooling means mounted on the heatsink of the present invention. As a wind blowing means such as a fan is mounted on the top face of the heatsink, the cooling apparatus of the present invention achieves a high cooling ability and a compact body.

BRIEF DESCRIPTION OF THE DRAWINGS

FIG. 17 shows an enlarged view illustrating the state of connection between the fins and the column of the heatsink in accordance with the first preferred embodiment of the present invention.

DETAILED DESCRIPTION OF PREFERRED EMBODIMENTS

The preferred embodiments of the present invention are described hereinafter with reference to the attached drawings.

The First Preferred Embodiment.

Figure 1A:
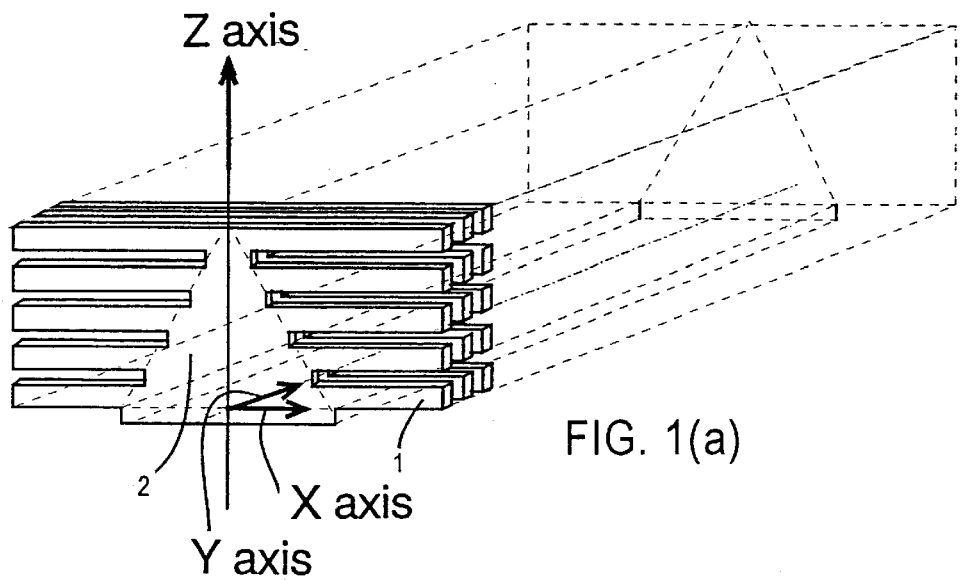
FIG. 1 shows a perspective view, a side view and a front view of the main part of a heatsink in accordance with a first preferred embodiment of the present invention.
Figure 1B:
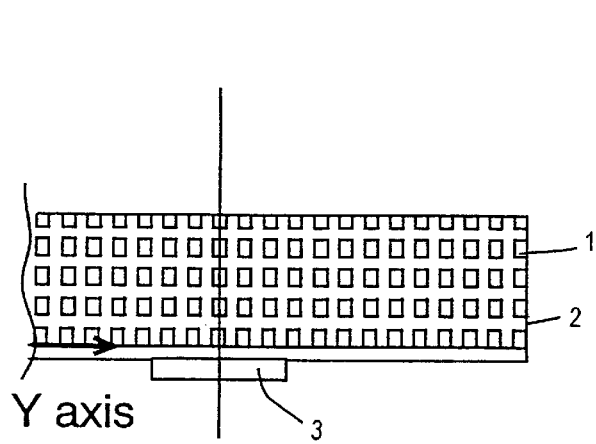
Figure 1C:
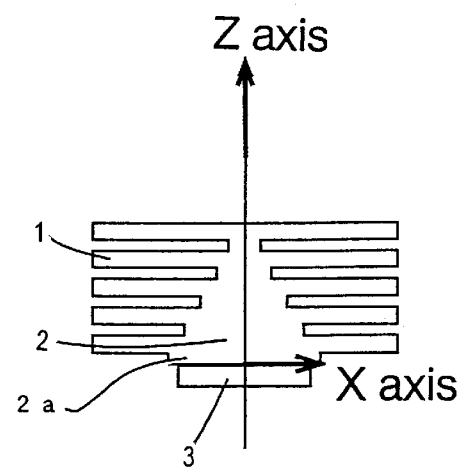

FIG. 1 shows a perspective view, a front view and a side view of the main part of the heatsink in accordance with the first preferred embodiment of the present invention. FIG. 1(a) is a perspective view of the main part of the heatsink according to the first preferred embodiment of the present invention. FIG. 1(b) is a front view of the heatsink of the present invention, viewed from the width direction of a column (hereinafter, X axis direction). FIG. 1(c) is a side view of the heatsink of the present invention viewed from the longitudinal direction of a column 2 (hereinafter, Y axis direction).

Figure 2A:
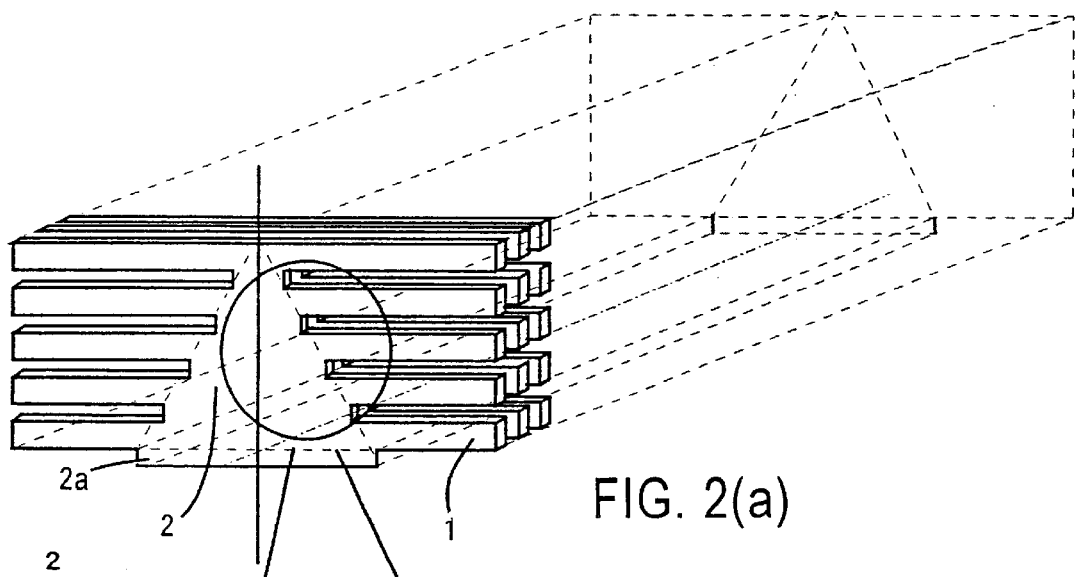
FIG. 2 shows a perspective view and enlarged side views of the main part of the heatsink in accordance with the first preferred embodiment of the present invention.

FIG. 2 shows a perspective view and a enlarged side view illustrating the main part of the heatsink according to the first preferred embodiment of the present invention.

In FIGS. 1(a)–1(c), a plurality of fins 1 are disposed on the column 2 (or heat conducting section). A heat conducting plate 2a which has a heat receiving face is disposed at the lower part of the column 2. The heat producing element 3 is disposed in the direction under the column 2 (hereinafter, negative Z axis direction). In sum, in this embodiment, the heatsink comprises the fins 1, the column 2 and the heat conducting plate 2a. The heat producing element 3 here is an electronic component which produces heat including transistors and semiconductors such as IC, LCI and MPU.

For the sake of convenience of description, width, longitudinal and height directions of the column are, in some cases, expressed as X axis, Y axis and Z axis directions as mentioned previously.

In FIG. 1, the column 2 is a prism of which a cross section through the Y axis is a triangle. Creating the shape of the column 2 in this manner improves contact between the column 2 and the heat producing element 3 and reduces waste of the materials. It especially contributes to providing a heatsink with a superior mountability and heat conductivity.

The column 2 has fins 1 disposed thereon. The fins 1 in FIG. 1 are disposed on both faces along Y axis of the column 2.

In the case of a heat dissipation device in contact with a small heat producing element, heat is generally diffused over a hemispherical temperature distribution range when the heat enters a isotropic material through a heat receiving face. Therefore, ideally the heatsink should have a hemispherical heat conducting section and a number of fins disposed radially with a center being the heat producing point located in the center of the heat conducting section. This construction can realize the highest possible heat dissipation properties. With this construction however, various problems other than property could rise. For example, shape or size of the heatsink could make actual use impossible, or manufacturing cost could be unrealistically high.

In the heatsink of this embodiment shown in FIG. 1, heat produced by the heat producing element 3 is received on the bottom surface of the heat conducting plate 2a of the column 2 (or heat receiving face) which contacts with the heating surface of the heat producing element 3. The heat is then diffused three-dimensionally in the directions of the X, Y and Z axes from the bottom surface of the column 2. In this case, since the column 2 is a prism, a stable hemispherical temperature distribution can be realized over a much larger area inside the column compared with the plate heat conducting section of the conventional plate-type and pin-type heatsinks. The heat emitted from the heat producing element 3 is conducted over the hemispherical temperature distribution range and spreads to the fins 1. As a result, the heatsink of this embodiment achieves significantly higher heat dissipation properties than the conventional heatsinks of the same size. Furthermore, even in the vicinity of both ends of the heatsink where such hemispherical temperature distribution is hard to obtain, fins 1 can sufficiently function as heat dissipation fins. The reason for this is that the sectional area of the column 2 is large enough to maintain a low heat resistance associated with the transfer of heat.

Figure 2B:
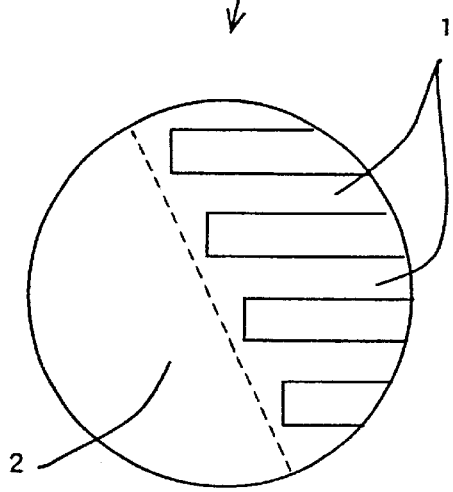
Figure 2C:
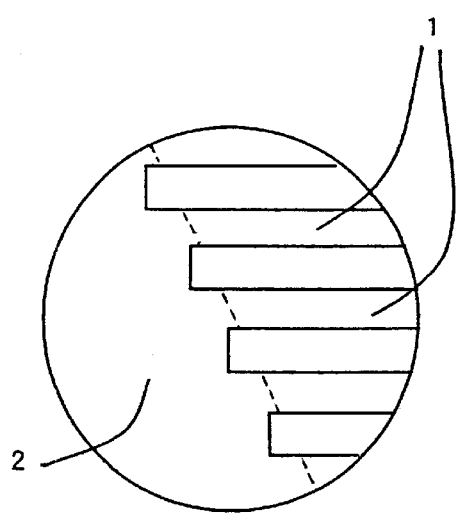
Figure 3A:
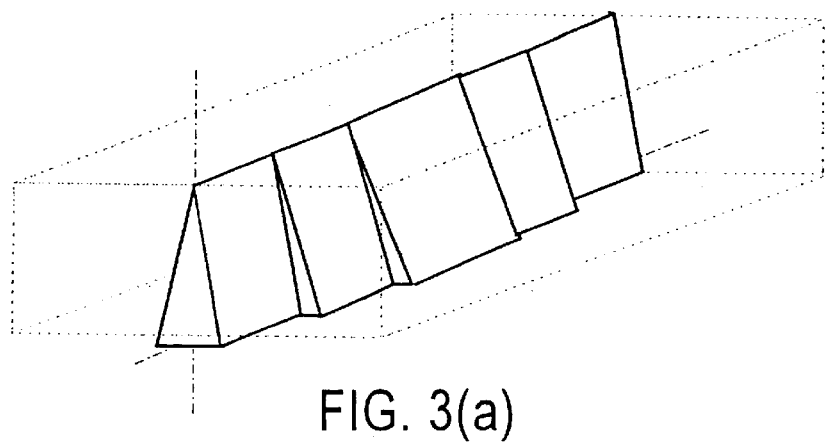
FIG. 3 shows a perspective view, a front view, a side view and a bottom view of a column in accordance with a second preferred embodiment of the present invention.
Figure 3B:
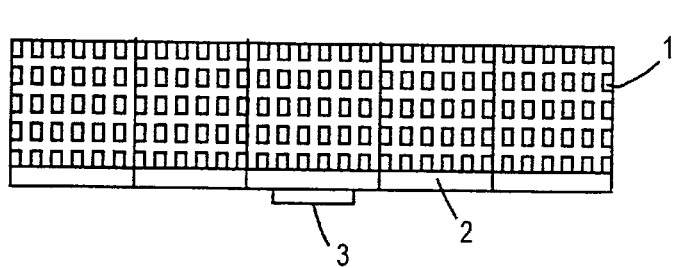
Figure 3C:
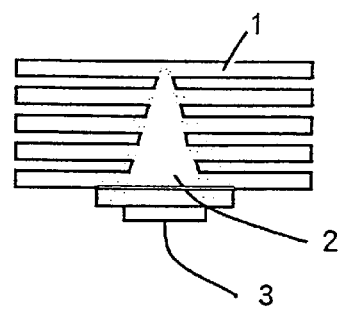
Figure 3D:
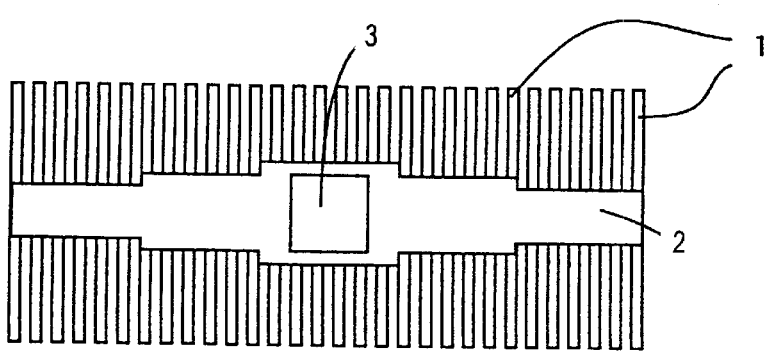
Figure 4A:
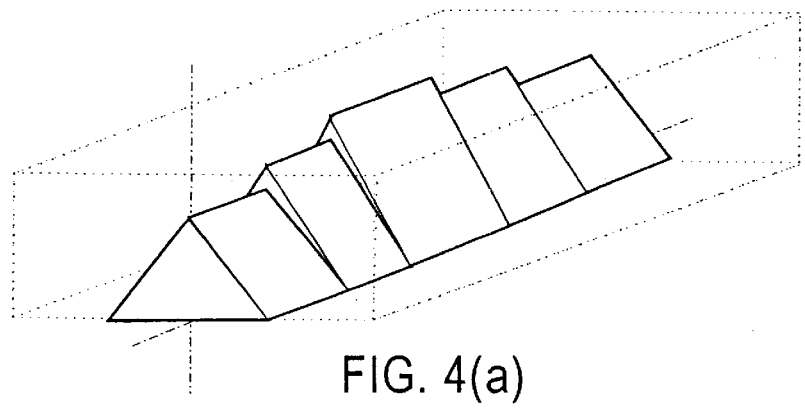
FIG. 4 shows a perspective view, a front view, a side view and a bottom view of another column in accordance with the second preferred embodiment of the present invention.
Figure 4B:
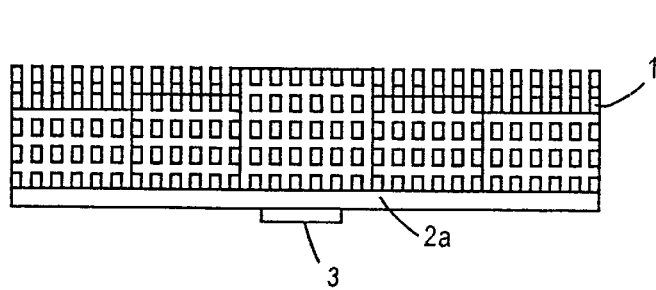
Figure 4C:
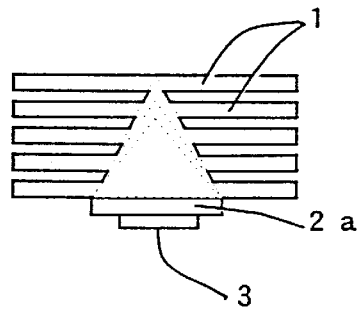
Figure 4D:
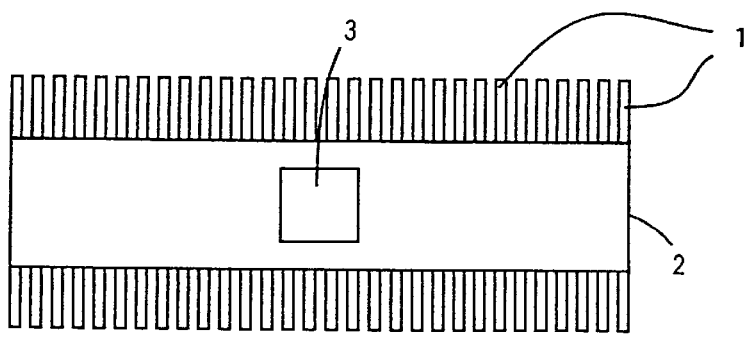

FIGS. 2(b) and 2(c) show relationship between the depth of the first and second slits.

In FIG. 2(b), the second slits are deeper than the first slits. If the first slits are shallower than the second slits, when a fluid blown into by a cooling fan mounted on the top partially flows toward the first slits, turbulent flow occurs at the points where there is a difference in depth. This will improve the heat dissipation properties.

Similarly in FIG. 2(c), the second slits are shallower than the first slits. In this case as well, if the second slits are deeper, turbulent flow occurs at the points where there is a difference in level when a fluid flows toward the second slits, thereby improving the heat dissipation properties. When a cooling fan or other air blowing means is mounted on top of the heatsink of the present invention, larger amount of air flows along the second slits than the first slits. Therefore, for better heat dissipation properties, it is preferable to select the construction illustrated in FIG. 2(c) where turbulent flow occurs along the second slits, rather than the construction illustrated in FIG. 2(b) where turbulent flow occurs along the first slits.

In these heatsinks, it is desirable to chamfer end faces of the fins 1 and the bottom corners of the column 2. The chamfering prevents chipping and generation of undesirable material. If a corner of the heatsink is sharp, the heatsink may contact with other components when it is being mounted onto an electronic component and break the component. When material is generated from a chipped corner and falls on wiring, it might trigger a short circuit and cause the electronic apparatus to malfunction.

The column 2 and the fins 1 can be integrally formed, or the fins can be adhered to the column 2 as separate parts with adhesives. As another method, the fins 1 can be press fitted into holes provided on the column 2.

When the column 2 and the fins 1 are integrally formed, productivity improves. Furthermore, heat conductivity improves as no heat-resistance part exists between the column 2 and the fins 1. When the fins 1 are fixed to the column 2 by the adhesives or press-fitting method, appropriate materials can be used for the column 2 and the fins 1, thereby promoting ease of design of the heatsink.

As for the shape of the fins 1, a square prism as shown in FIG. 1, a cylinder, a polygonal prism, a elliptical cylinder and the like can be used. By forming the fins 1 with the shape of a square prism, the mounting density of the fins 1 can be enhanced, thereby improving the heat dissipation.

In this embodiment, thickness of the fins 1 was set approximately the same. However, the fins 1 can be designed such that they have a taper of which either the thickest or thinnest part is fixed to the column 2. The fins 1 can also be designed so that the center of it is thinner or thicker than the other parts.

When the fins are constructed of aluminum or aluminum alloy, resistance to corrosion and insulation properties can be improved by treating its surface to become an alumina (forming aluminum oxide film).

Chamfering of the corners of the fins 1 prevents generation of the undesirable material caused by chipping as previously mentioned.

Furthermore, when the fins 1 are disposed at regular, constant intervals, heat dissipation property and productivity are desirably improved.

Desirable materials for the heatsinks are these which have a heat conductivity at 100° C. of 100 k/W·m$^{-1}$·K$^{-1}$ or more. Such materials can be selected from zinc, aluminum, brass, gold, silver, tungsten, copper, beryllium, magnesium, and molybdenum (hereinafter, material group), and used in their pure form. These materials can also be used in an alloy form. In the latter case it is possible to either select a plurality of materials from the above-mentioned group or select at least one from the material group and combine it with materials not included in the above group. In this embodiment, aluminum or an aluminum alloy was used for the heatsink because of its ease of processing and low cost.

The Second Preferred Embodiment

FIG. 3 shows a perspective view, a front view, a side view and a bottom view of a column of the second preferred embodiment. FIG. 4 shows a perspective view, a front view, a side view and a bottom view of another column of this embodiment. FIG. 5 shows a perspective view of yet another column of the second preferred embodiment. FIGS. 3 to 5 show examples in which a sectional area through the Y axis of the columns of the heatsink tapers off gradually or in stages with the largest part being in the vicinity of the heat producing element.

FIG. 3 is a first example of a sectional area through the Y axis of the column 2, which tapers off away from the heat producing element. In this case, the sectional area is changed by narrowing the width of the column in stages towards both ends from the center of the heatsink where the heat receiving face is located.

In FIG. 4, a second example is shown. The sectional area in this example is changed by lowering the height of the column in stages from the center of the heatsink without changing its base width.

Figure 5A:
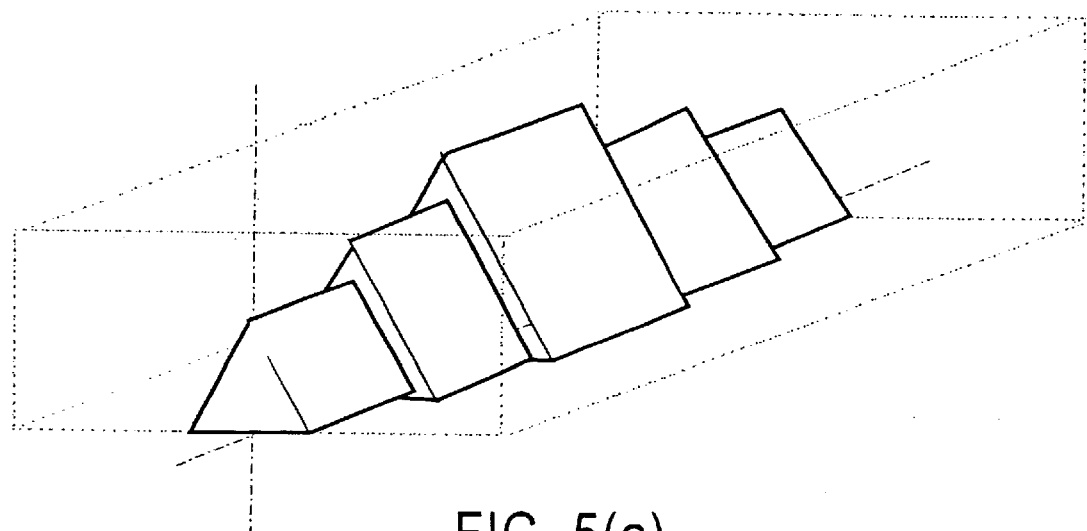
FIG. 5 shows a perspective view of yet another column in accordance with the second preferred embodiment of the present invention.
Figure 5B:
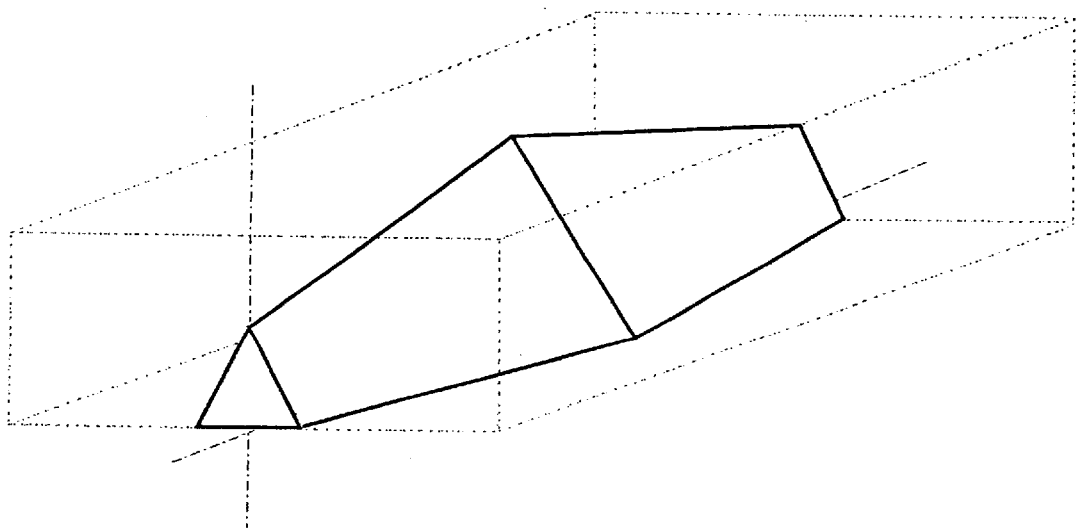

FIGS. 5(a) and 5(b) are a third example in which the sectional area of the column is reduced by tapering both height and width of the column gradually or in stages from the center of the column.

In the heatsink of the present invention, heat produced by the heat producing element is diffused throughout the column via the heat receiving face. Therefore, to maintain a low heat resistance, sectional area of the column at the ends of the heatsink desirably is large. Having said that however, it does not have to be as large as the sectional area right above the heat producing element. The reason for this is that, as heat is dissipated by the fins as it is transferred from the vicinity of the heat producing element of the heatsink to both ends, heat flow itself declines as it goes closer to the ends. Thus, the sectional area of the column can be smaller at the ends than at the vicinity of the heat producing element. At the ends of the heatsink of this embodiment, surface area of the heat dissipation fins can be expanded by the amount equal to the reduction in the sectional area of the column. This allows the heat dissipation properties to improve at the ends, thereby further enhancing the overall heat dissipation properties.

The sectional area of the column through the Y axis tapers off in stages away from the heat producing element. This construction allows a reduction in the weight of the heatsink while maintaining high heat dissipation properties. Ideally, the sectional area of the column is reduced continuously rather than in stages. The rate of tapering of the sectional area can be calculated by considering the heat flow and the amount of the heat dissipated at various points away from the vicinity of the heat producing element to the ends.

The Third Preferred Embodiment

Figure 6:
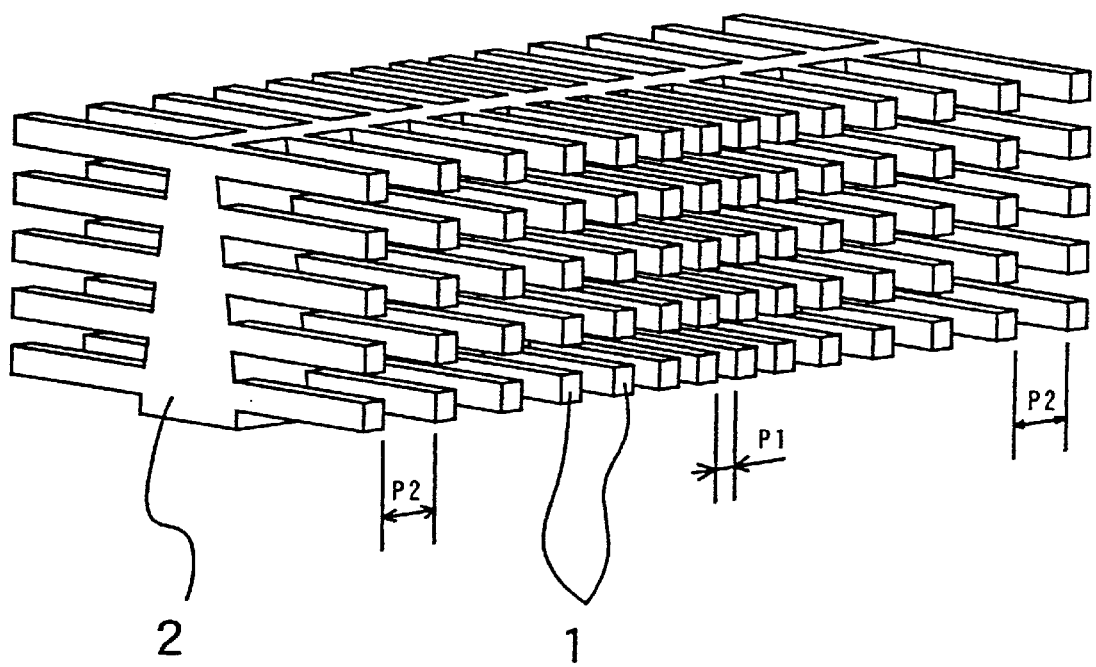
FIG. 6 shows a perspective view illustrating intervals of fins of the heatsink in accordance with a third preferred embodiment of the present invention.

FIG. 6 shows a perspective view illustrating the intervals between fins of the heatsink of the third preferred embodiment. As shown in FIG. 6, in the heatsink of this embodiment, intervals of the plurality of second slits disposed on the side faces of the column 2, are larger at the ends (P2) of the heatsink than at the center (P1). Due to this construction, in the center of the heatsink which contributes to the heat dissipation, the density of the fins is increased and sufficient surface area is secured, thereby improving the heat dissipation properties. In contrast, at the ends of the heatsink where the contribution to the heat dissipation is relatively low, intervals between the fins are large. Thus, resistance in the air flow route declines and air flow speed increases. These effects thus far mentioned, work together to allow the heatsink of this embodiment to achieve high heat dissipation properties.

The Fourth Preferred Embodiment

Figure 7:
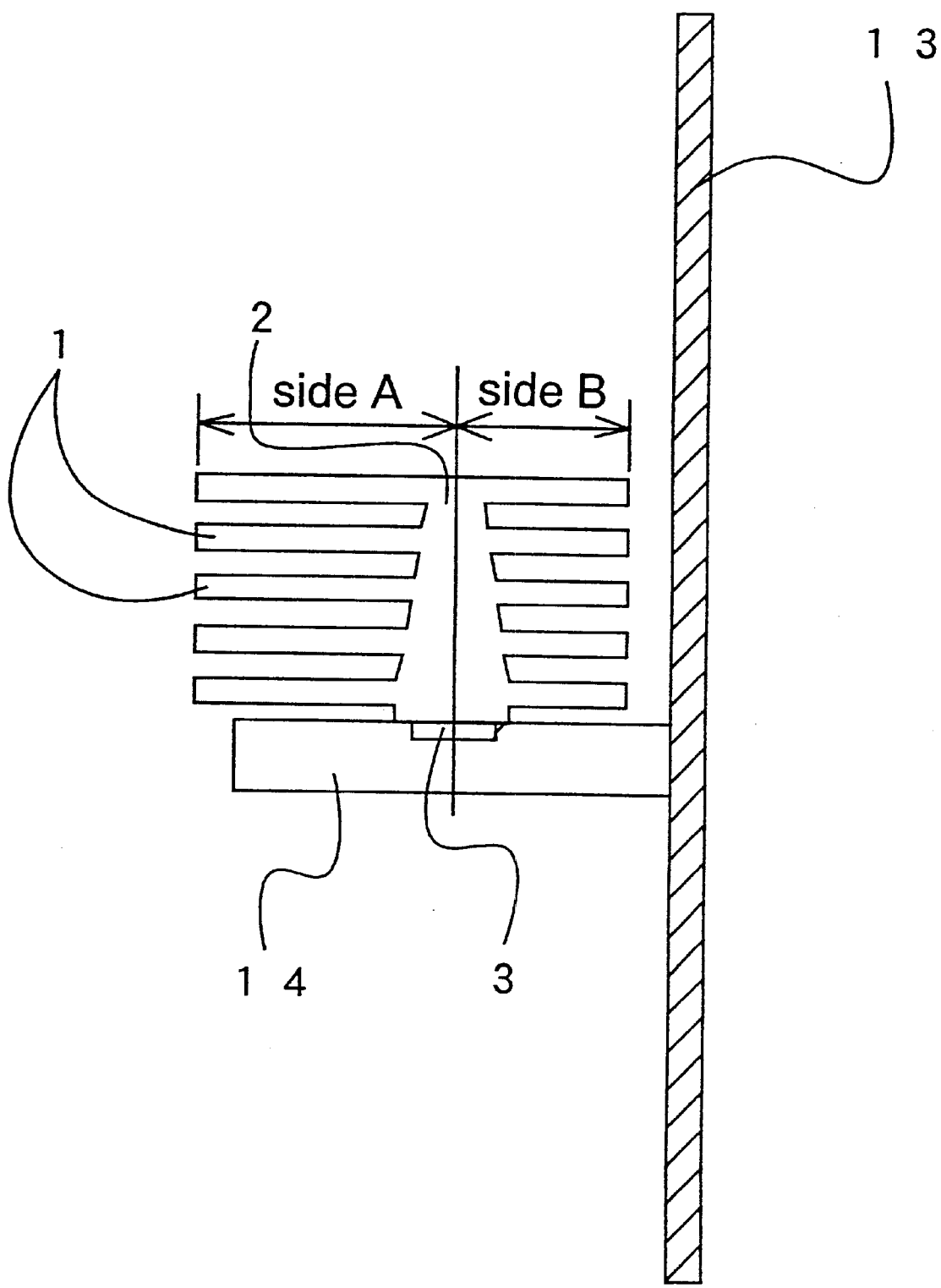
FIG. 7 shows a side view of the heatsink on which a heat producing element mounted in accordance with a fourth preferred embodiment of the present invention.

FIG. 7 shows a side view of the heatsink which is mounted on a heat producing element in accordance with the fourth preferred embodiment. In this embodiment, the centers of the heatsink and the heat producing element are not aligned. As FIG. 7 shows, when a electronic component supporting substrate 14 having the heat producing element 3 mounted thereon, is disposed on a printed circuit board 13, sufficient space required on one side of the heatsink is in some cases not achieved due to the sizes of the supporting substrate 14 and the printed circuit board. In such a case, the size of a side B can be shortened and a side A, extended as shown in FIG. 7. In other words, by placing the central lines of the column and the heatsink in such a manner that they do not align, the fins with sufficient surface area can be secured, thereby obtaining the heat dissipation properties as high as that of the first preferred embodiment.

Figure 8A:
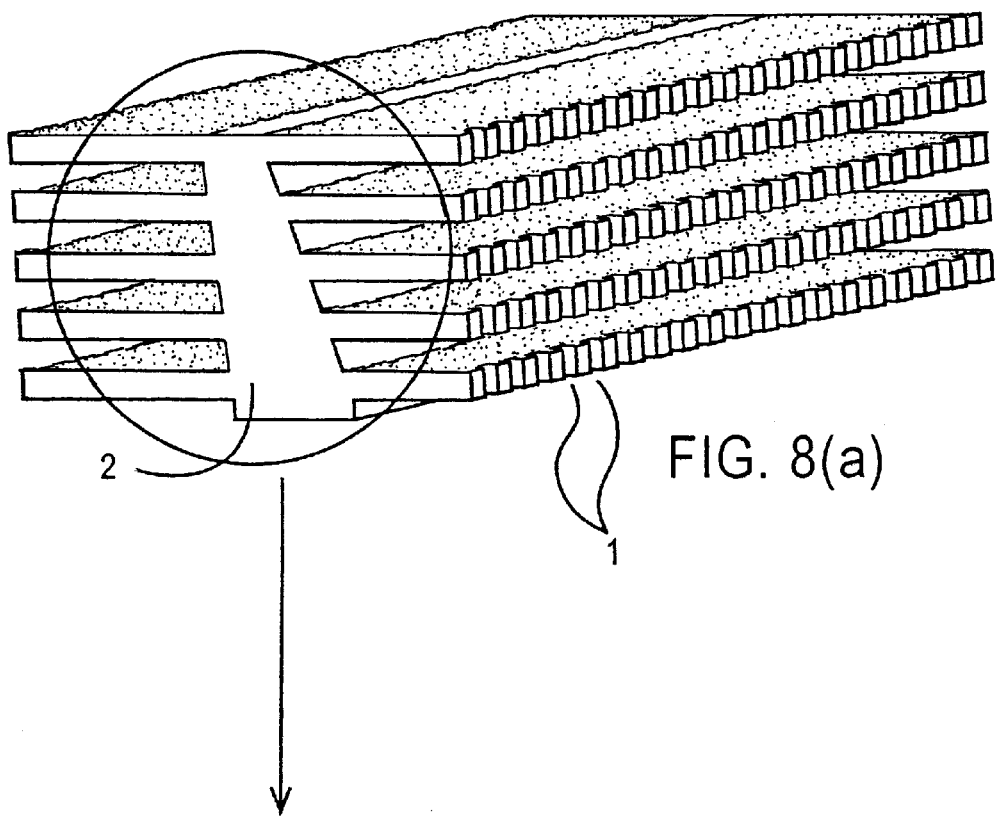
FIG. 8 shows a perspective view and a side view of another heatsink in accordance with the fourth preferred embodiment of the present invention.
Figure 8B:
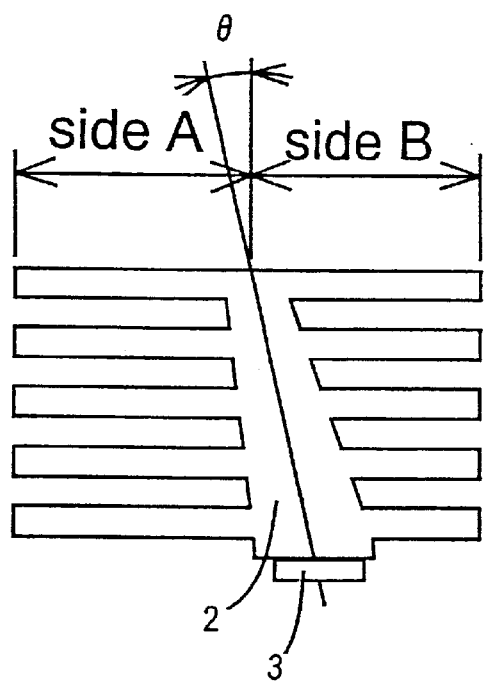

FIG. 8 shows a perspective view and a side view of the heatsink of another construction of this embodiment. In the heatsink of the FIG. 8, the central line of the cross section of the column 2 is tilted. As FIG. 8 shows, due to the sizes of the supporting substrate 14 and the printed circuit board 13, tilting the central line of the cross section of the column by θ degrees can achieve a column which allows heat produced by the heat producing element to be sufficiently transferred to the fins disposed above even when the position of the heat producing element is not aligned with the center of the width direction of the heatsink. Further, according to this embodiment, the area into which the cooling fluid flows can be provided almost equally on both sides of the column. Due to this, the heat dissipation on both sides of the column can be equalized, thereby realizing sufficient heat dissipation properties for the heatsink as a whole.

The foregoing description was given on the basis of the central lines of the cross section of the column 2 and the width direction (Y axis direction) of the heatsink being parallel. However, central lines of the bottom of the heatsink and the column 2 can cross each other. It is also possible for faces passing though the central line of the bottom of the heatsink and the central line of the column 2 to intersect.

The Fifth Preferred Embodiment

FIG. 9 shows perspective views illustrating a manufacturing method of the heatsink of the fifth preferred embodiment. FIG. 10 shows perspective views illustrating the extrusion process of the manufacturing method of the first preferred embodiment. FIG. 11 shows a side view and a partial enlarged view of the heatsink fixed to jigs during a cutting process for manufacturing the pillar-type protrusions. FIG. 12 shows a side view and a partial enlarged view of the heatsink fixed to jigs in another way during a cutting process.

Figure 9A:
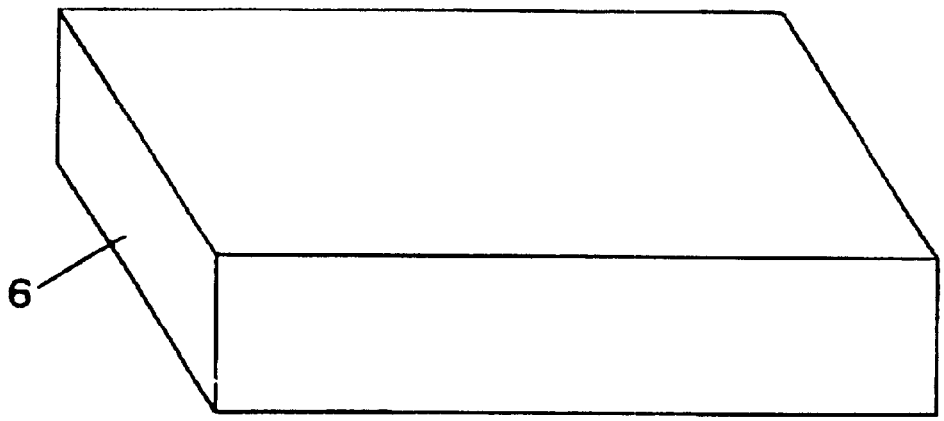
FIG. 9 shows perspective views illustrating a manufacturing method of the heatsink in accordance with a first preferred embodiment of the present invention.
Figure 9B:
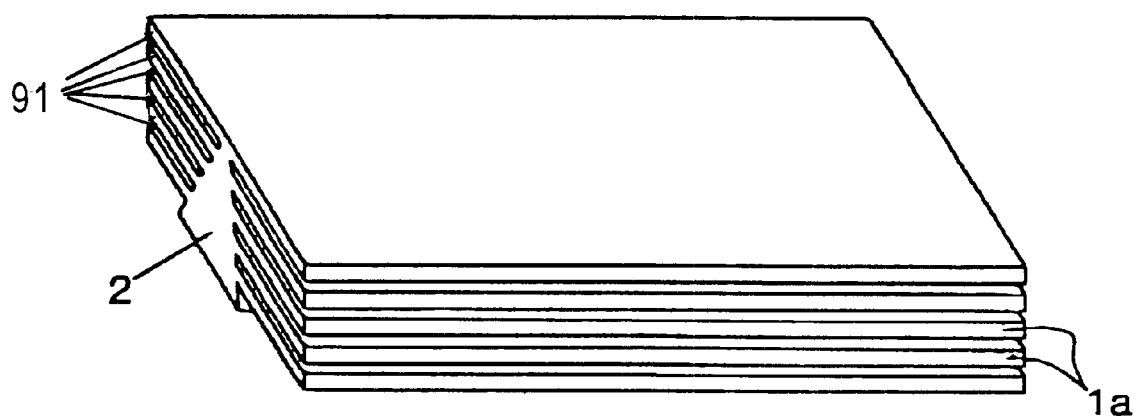
Figure 9C:
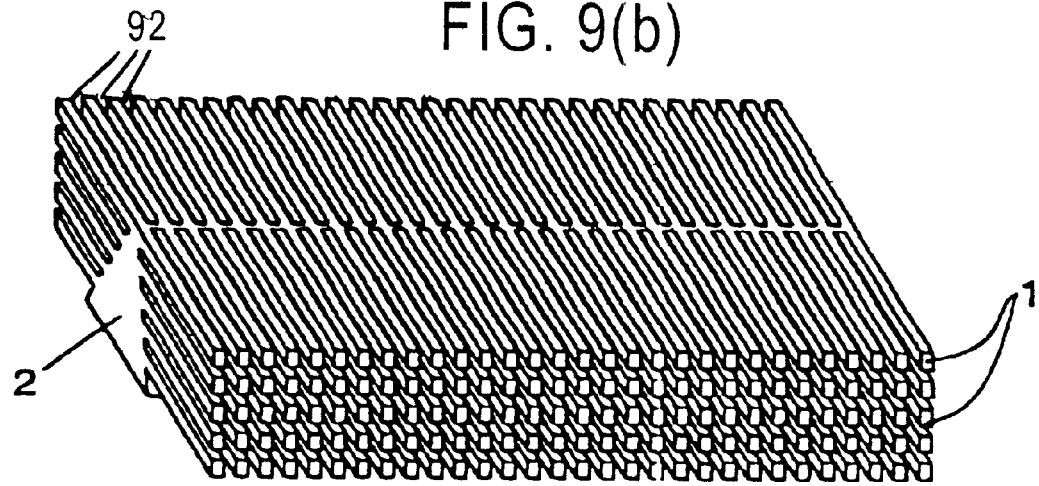

FIG. 9(a) shows an initial condition of a heat conductive material 6. In FIG. 9(b), a plurality of plate fins 1a are formed simultaneously on the column 2 and along the Y axis direction of the column 2 by providing first slits 91 by a cutting, extrusion or pultrusion method. FIG. 9(c) shows a second process in which a plurality of fins 1 are formed on both side faces of the column by providing second slits 92 vertically along the length of the plate fins 1a.

The first process is conducted by a cutting, extrusion or pultrusion method. The example below refers to the extrusion method.

Figure 10A:
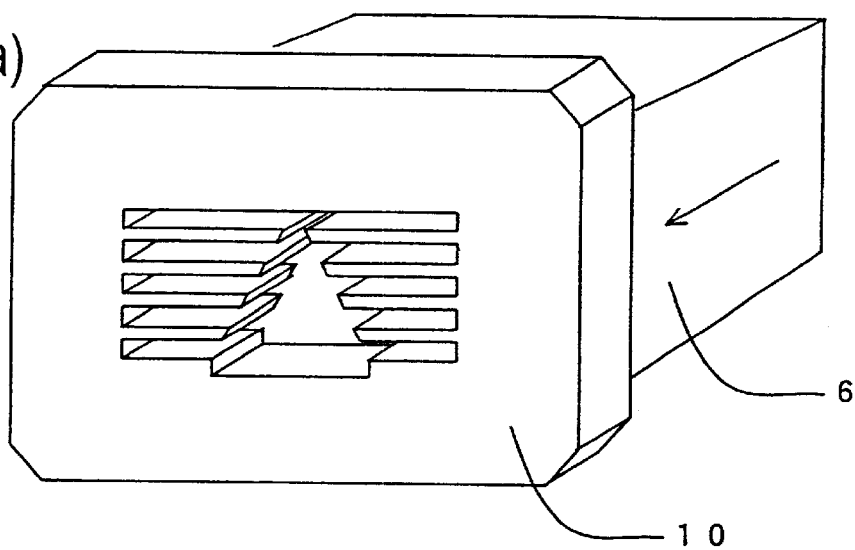
FIG. 10 shows perspective views illustrating extruding process of the manufacturing method in accordance with the first preferred embodiment of the present invention.
Figure 10B:
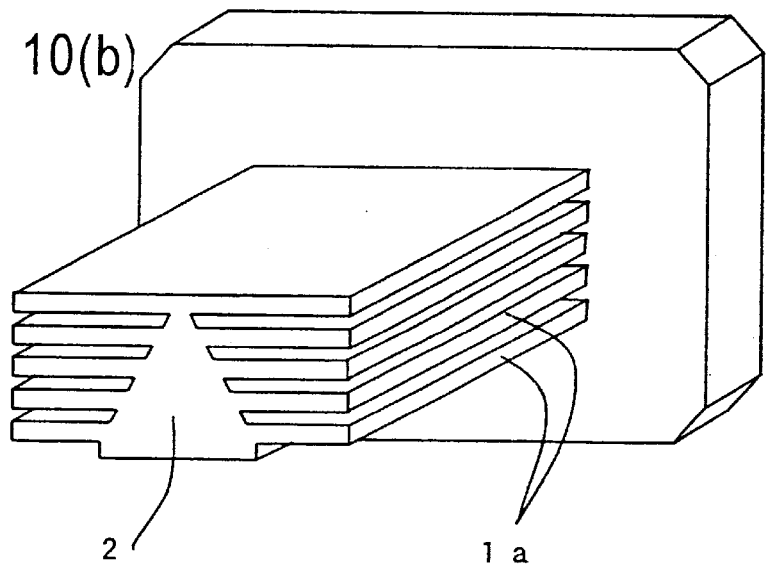

In FIG. 10(a), a high-temperature heat conductive material 6 is pressed into an extrusion process die 10 in the direction marked by an arrow. Successively, the heat conductive material 6 is pressed out and plastically deformed into the same shape as the mold cavity.

Figure 10C:
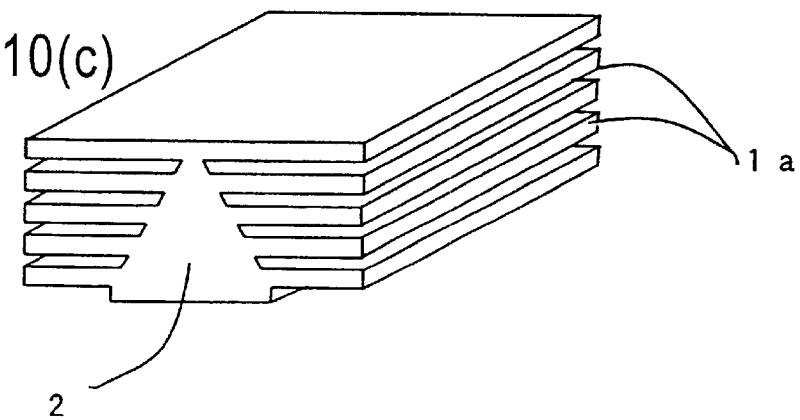

At this point, the column 2 and the plate fins 1a are formed simultaneously as shown in FIG. 9(b). The first process is completed by cutting at, a predetermined length the column 2 as shown in FIG. 10(c).

Figure 11A:
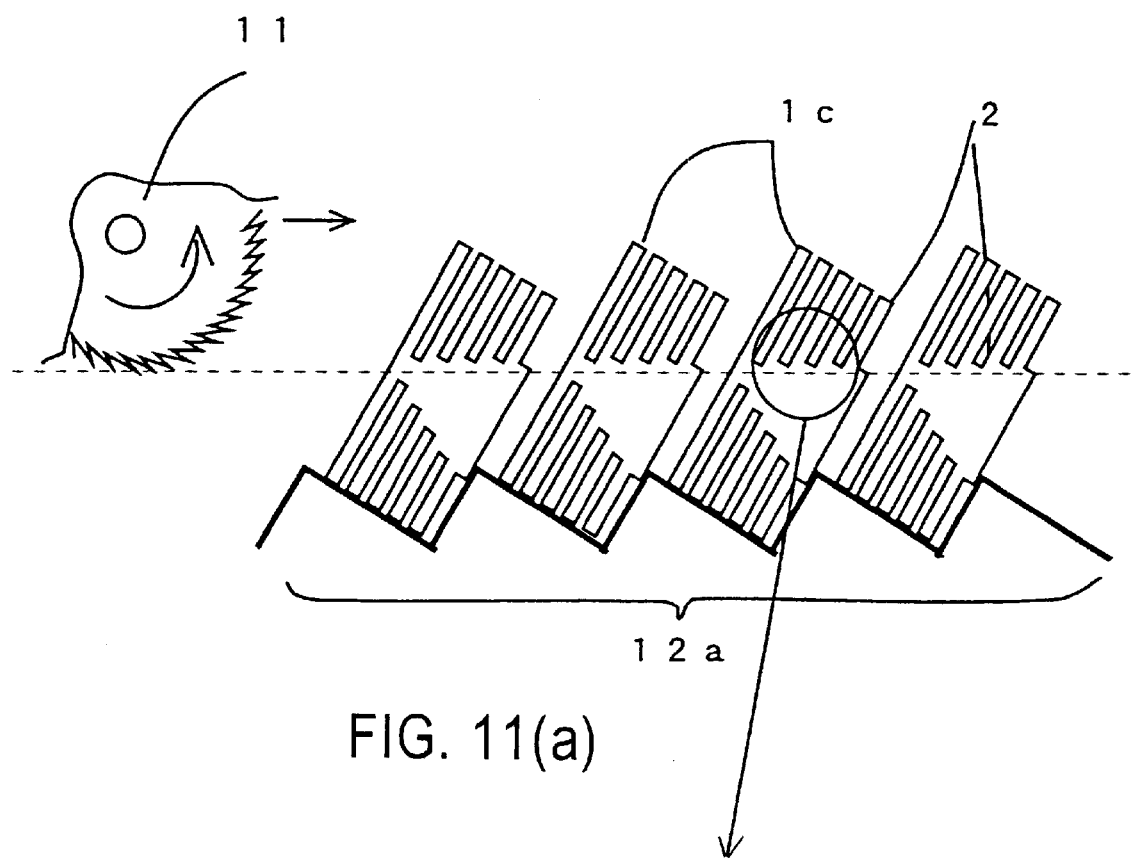
FIG. 11 shows a side view and a partial enlarged view of the heatsink fixed to jigs during a cutting process of the manufacturing method of the heatsink in accordance with the first embodiment of the present invention.

The second process is to form the second slits. As FIGS. 11 and 12 show, a number of pin-type fins are formed by the cutting process. In this embodiment, as shown in FIG. 11(a), a plurality of heatsinks are placed parallel to one another on a tilted FIG 12a, and one of the two side faces of the column 2 is given the slits by a cutting tool 11 and then the other face undergoes the same process.

Figure 11B:
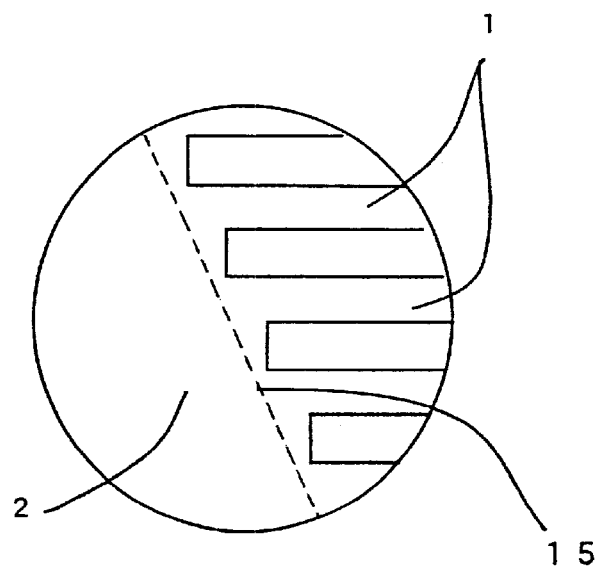
Figure 12A:
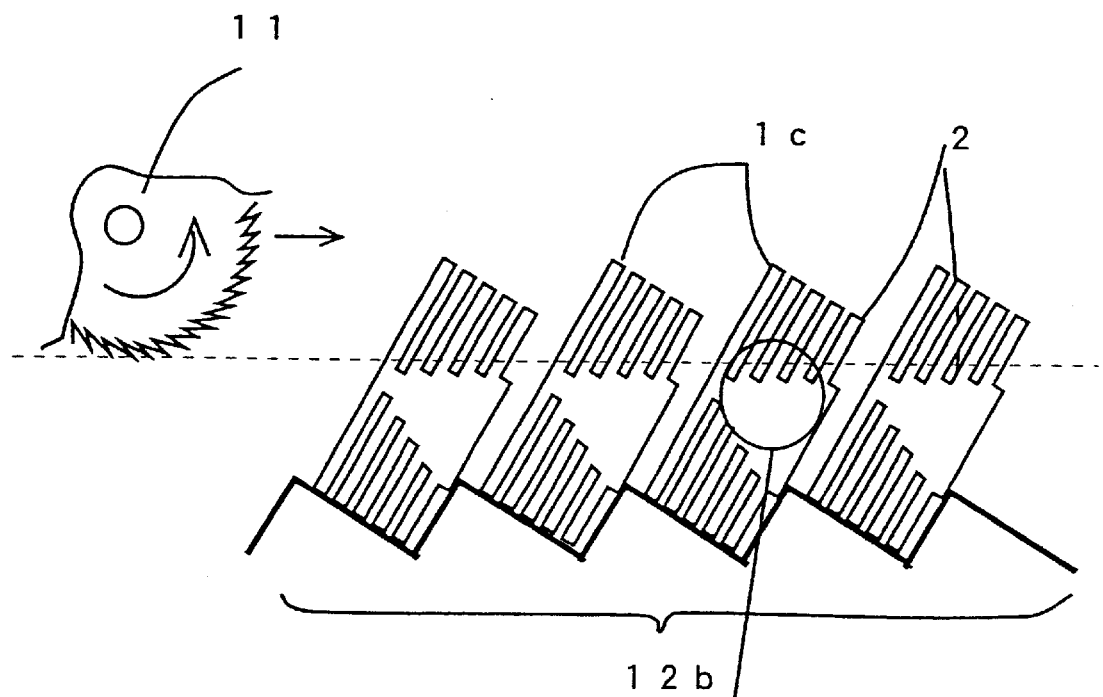
FIG. 12 shows a side view and a partial enlarged view of the heatsink fixed to jigs in another way during a cutting process of the manufacturing method of the heatsink in accordance with the first embodiment of the present invention.

If the second slits provided by the cutting tool 11 are deeper than the first slits as represented by a process line 15 of FIG. 11(b), the difference in levels is made in the direction of the first slit. Such a difference in levels causes fluid flowing in this direction to be in turbulence, thereby enhancing the heat dissipation properties.

Figure 12B:
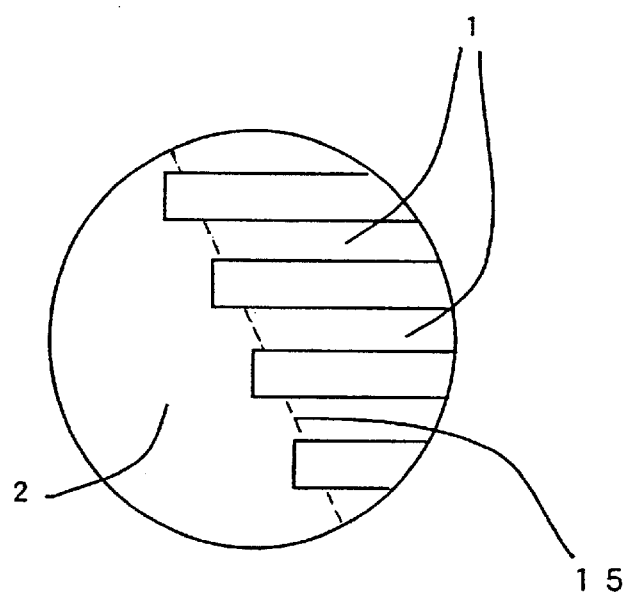

If the second slits provided by the cutting tool 11 are shallower than the first slits as represented by the process line 15 of FIG. 12(b), the difference in levels is made in the direction of the second slit. Such difference in levels cause fluid flowing in this direction to be in turbulence which helps increase the heat dissipation properties.

Thus, with this manufacturing method, a compact, high-performance heatsink with a number of pin-type fins 1 can be manufactured effectively at lower cost.

The above-mentioned cutting process can be conducted simultaneously by using a plurality of cutting tools.

In the construction shown in FIGS. 3–5, the cross section in the longitudinal direction of the column tapers off with the largest area being in the vicinity of the heat producing element (the center of the heatsink). With this construction, it is also easy to manufacture a high-performance heatsink, just by making the depth of the second slits deepen gradually or in stages as the distance from the vicinity of the heat producing element increases.

Figure 13A:
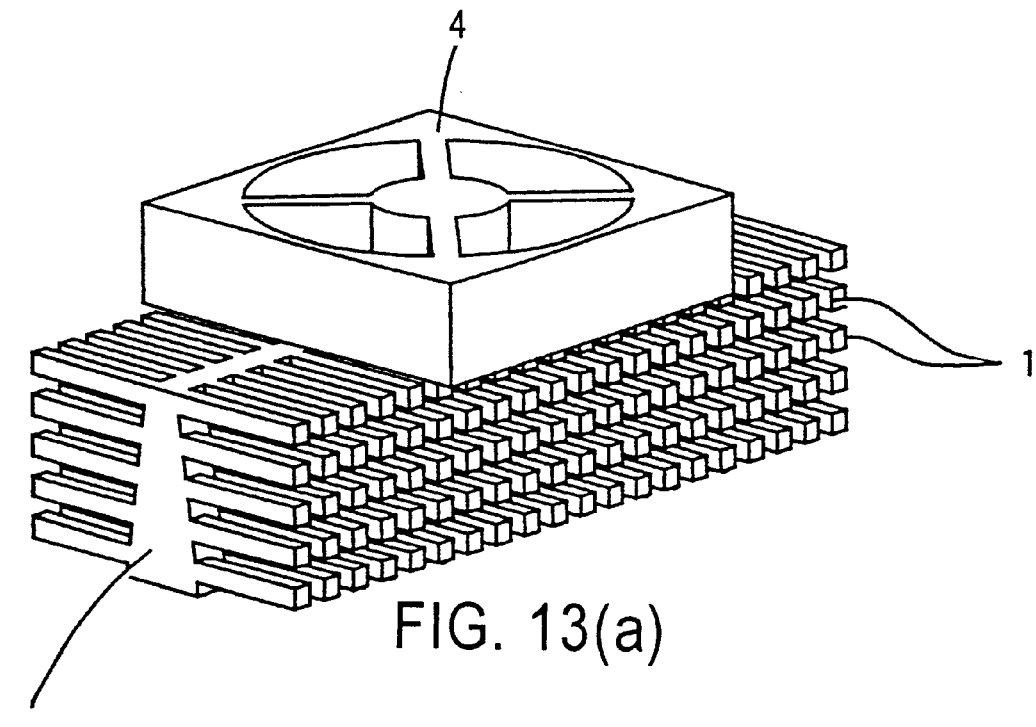
FIG. 13 shows perspective views of the cooling apparatus having cooling fans mounted on the top of the heatsink in accordance with the first and second preferred embodiments of the present invention.
Figure 13B:
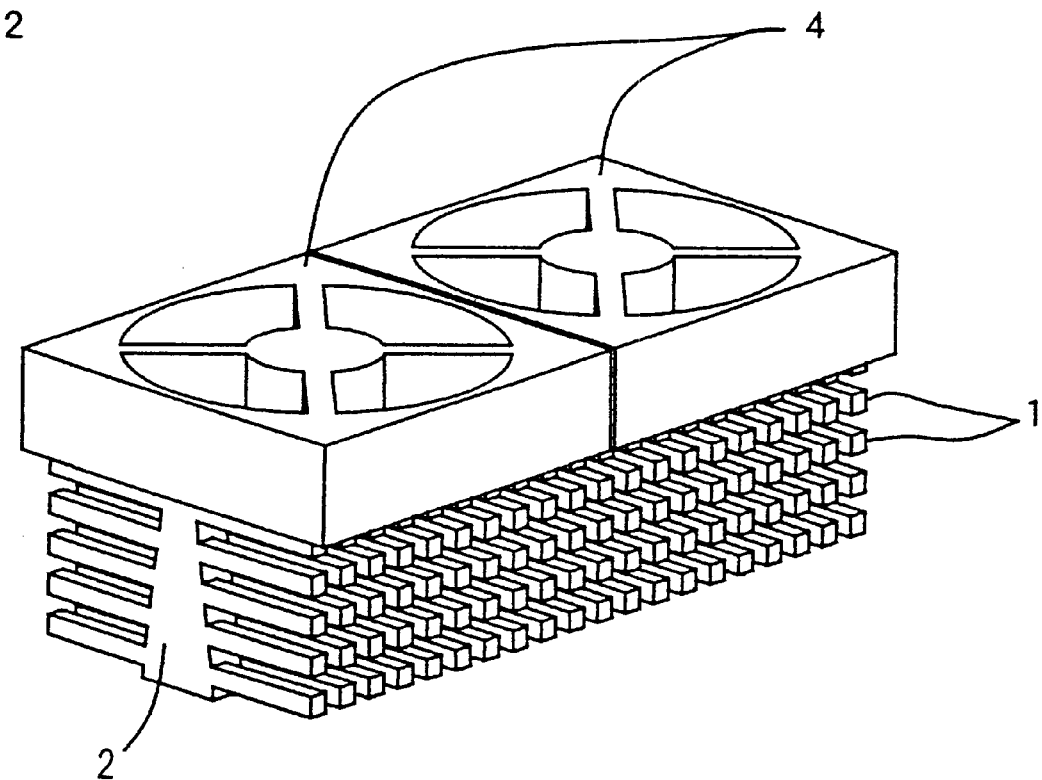
Figure 14A:
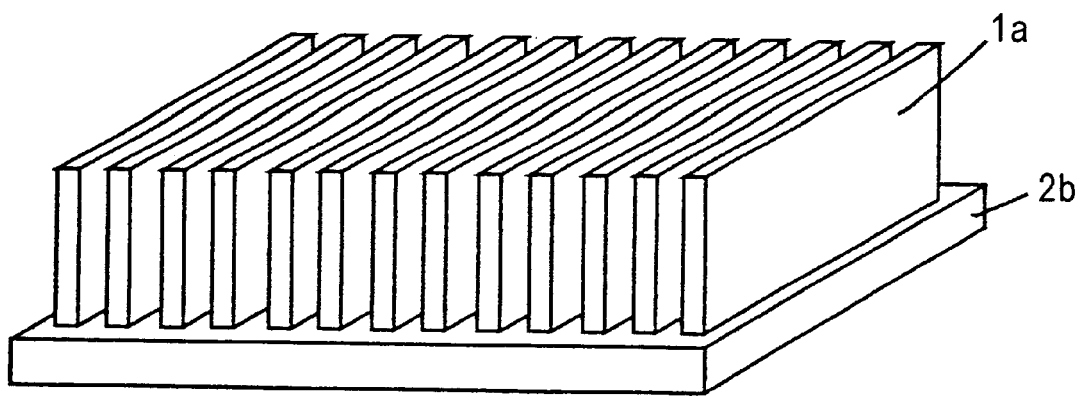
FIG. 14 shows perspective views illustrating construction of a conventional heatsink.
Figure 14B:
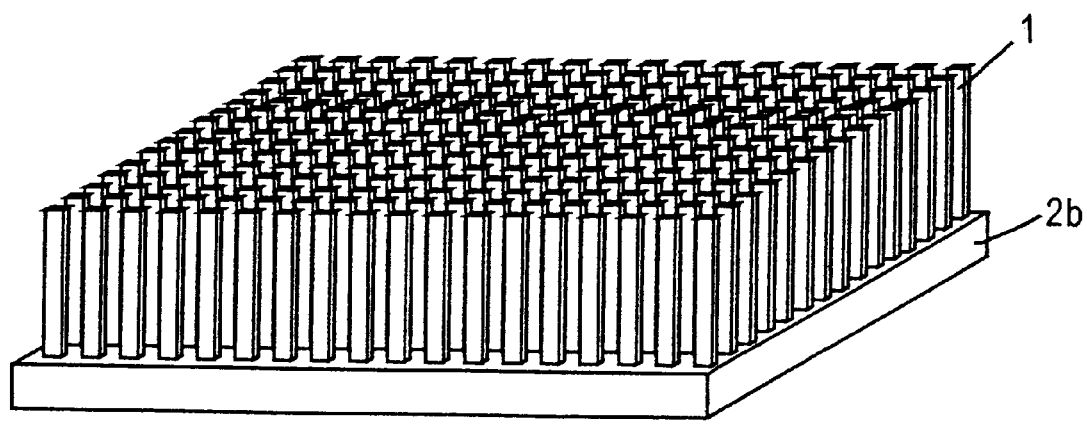
Figure 15A:
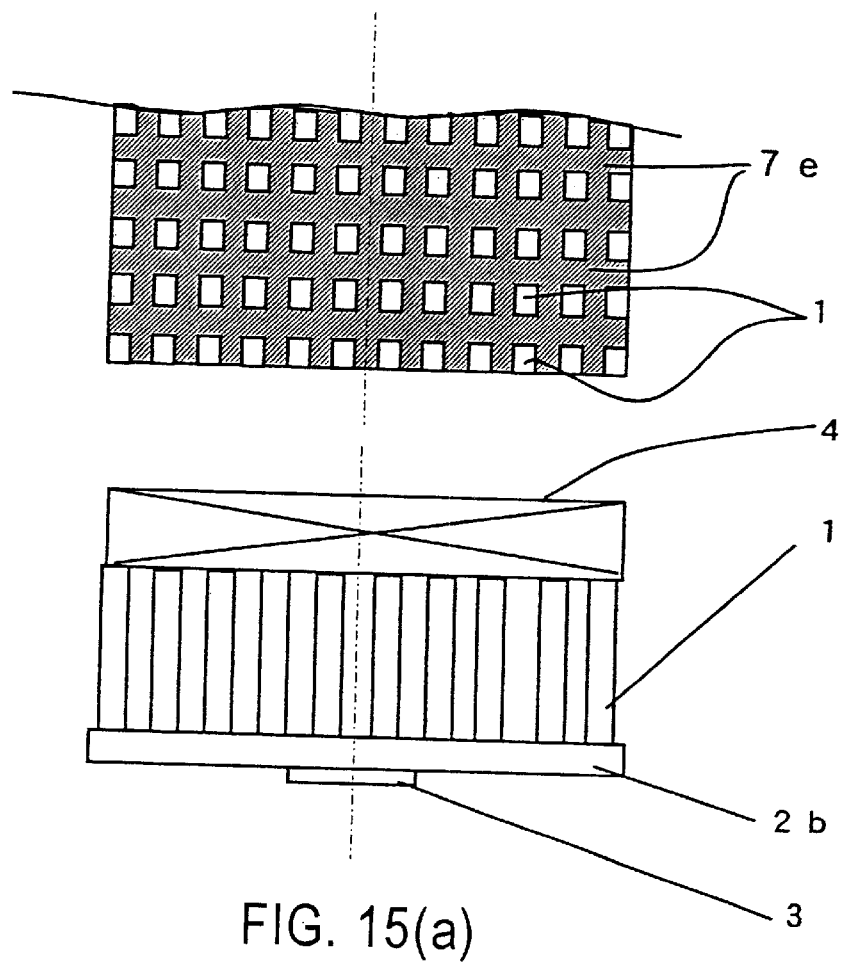
FIG. 15 shows a plan view and side views illustrating construction of a conventional cooling apparatus.
Figure 15B:
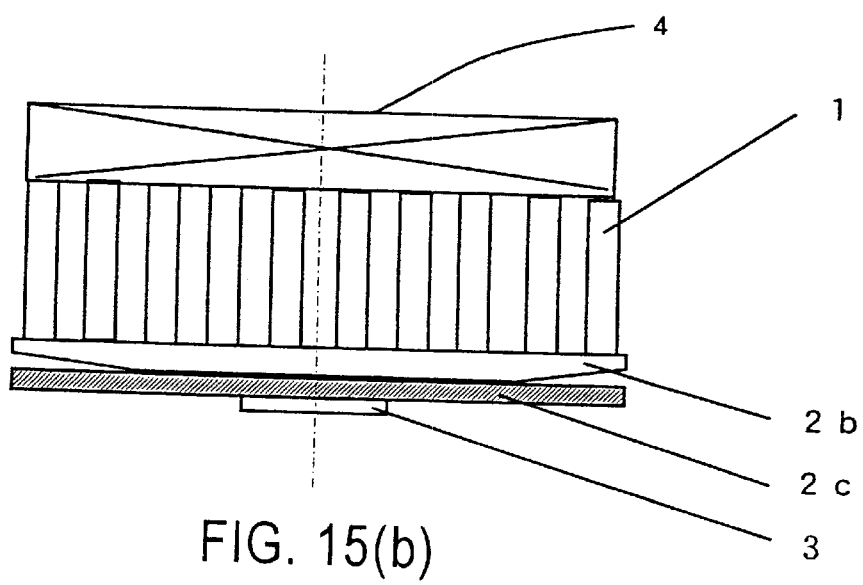
Figure 16A:
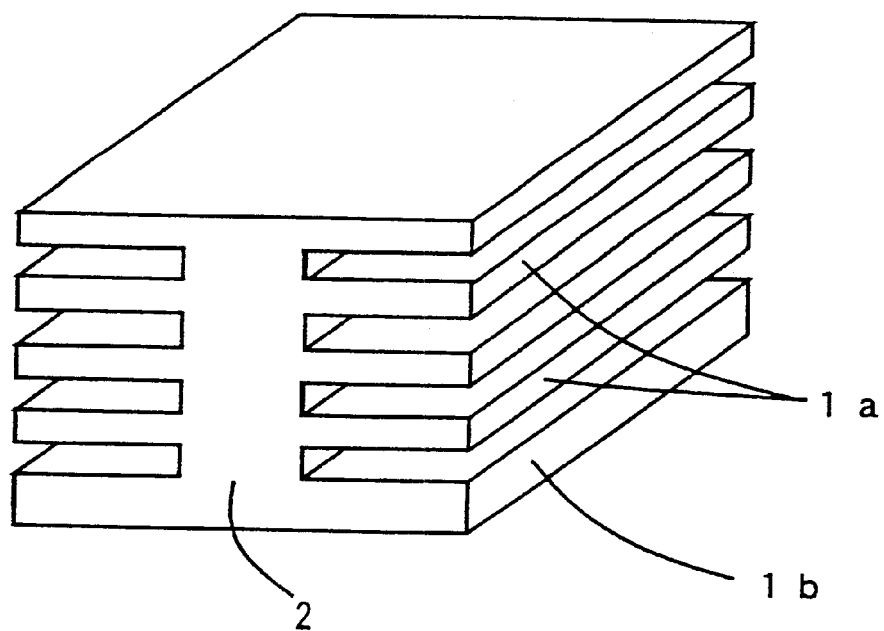
FIG. 16 shows a perspective view and a side view illustrating construction of another conventional heatsink.
Figure 16B:
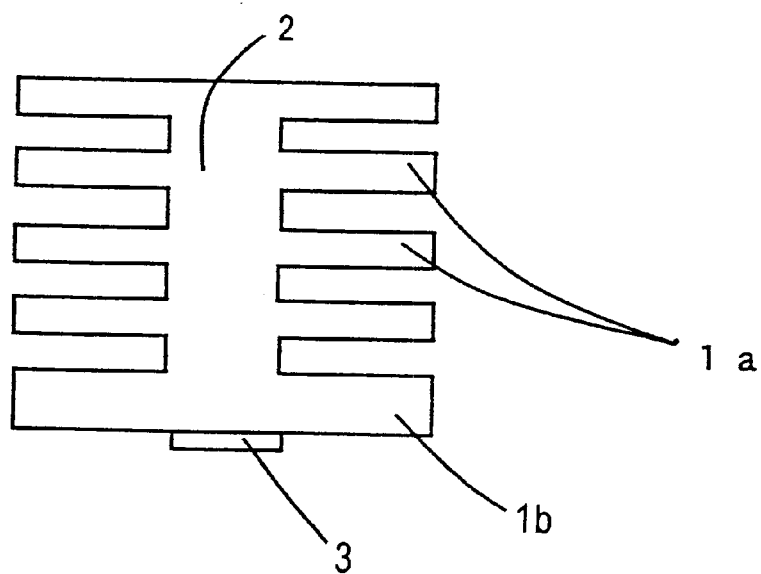

FIG. 13 shows perspective views of the cooling apparatus having cooling fans mounted on the top of the heatsink in accordance with the first and second preferred embodiments of the present invention. FIGS. 13(a) and 13(b) show the cooling apparatus where one cooling fan and two cooling fans respectively are disposed on the heatsink of the present invention. The cooling fan 4 can be mounted on top of the heatsink with screws, adhesives, clips, belt, or clip pins. The height of the heatsink of the present invention can be lowered while maintaining high cooling capacity. Therefore, the overall height can be kept low even when the cooling fan is mounted, thereby achieving a compact cooling apparatus.

The cooling fan was used in this embodiment, however, heat exchange elements such as Peltier elements can alternatively be used as a cooling means. As yet another cooling means, a heat pipe or liquid such as water can be used to transfer the heat of the heatsink to an other place to cool it down.

Examples in FIG. 2 shows the cases when the second slits are deeper than the first slits and vice versa. However, as FIGS. 17(a) and 17(b) show, some of the first and second slits can be deeper than the other. When the air blown by the cooling fan or other blowing means mounted on the top flows in the direction of the second slits, turbulence flow occurs where the levels are different. This improves the heat dissipation properties. Further, it is also possible to set the second slits to be deeper than the first slits as shown in FIG. 17(c), the second slits, partially deeper than the first slits as shown in FIG. 17(d), and set the depth of the first and second slits to be the same at the predetermined points. These constructions allow air flow created by the air blowing means to be in turbulence. This contributes to control the air flow, and enhancing heat dissipating properties.

In FIG. 17, the bottom of the first slits is rectangular, however, it can be a shape with an acute angle or have round corners.

As described so far, the heatsink of the present invention, which forms part of the cooling apparatus has fins 1 on both side faces of the column 2 functioning as a heat conducting section. The cooling apparatus of this embodiment will allow superior cooling ability compared with other conventional cooling apparatus of the same volume. In other words, for the same performance, the heatsink of the present invention can provide the smallest and lightest construction.

The heatsinks of the present invention improve the diffusing effect of the heat produced by the heat producing element by introducing a pole-type column as a heat conducting section. Furthermore, sufficient heat dissipating area can be secured since the fins are provided on both faces of the column, thereby realizing high heat dissipation ability and a reduction in size.

Introduction of the heatsink allows the cooling apparatus of the present invention to achieve higher performance and smaller size compared with the conventional apparatus.

The manufacturing method of the heatsink of the present invention achieves productive and low-cost manufacturing of high performance heatsinks.

What is claimed is:

1. A heatsink comprising;
   a column having a heat receiving face; and
   a plurality of pillar-type protrusions formed by;
      a plurality of first slits formed on a face other than the heat receiving face of said column, and
      a plurality of second slits formed transversely to said first slits,
   wherein depths of said first and second slits on said column are different, and said column has a configuration such that a cross-sectional width of the column decreases as said column extends away from the heat receiving face.

2. The heatsink of claim 1, wherein a sectional area in a longitudinal direction of said column decreases in one of tapering and step by step towards the ends of the heatsink.

3. The heatsink of claim 1, wherein a sectional area vertical to the heat receiving face of said column decreases in one of tapering and step by step towards the ends of said heatsink.

4. The heatsink of claim 1, wherein a width of said second slit is larger at ends than in a center.

5. The heatsink of claim 1, wherein an average length of said pillar-type protrusions disposed on one face of said column is different from an average length of said pillar-type protrusions disposed on another face of said column.

6. The heatsink of claim 1, wherein a central axis of said column corresponding to the height of said column is not orthogonal with said heat receiving face.

7. The heatsink of claim 1, wherein said cross-sectional width of the column decreases in a continuous manner.

8. The heatsink of claim 1, wherein the length of said plurality of pillar-type protrusions increases as a vertical distance between said pillar-type protrusions and a surface of said heat receiving face increases.

9. A cooling apparatus comprising:
   a heatsink comprising;
      a column having a heat receiving face;
      a plurality of first slits formed on a face of the column other than the heat receiving face; and
      a plurality of second slits formed transversely to the first slits,
      wherein depths of said first and second slits in the column are different and said column has a configuration such that a cross-sectional width of the column decreases as said column extends away from the heat receiving face; and
   a cooling means.

10. The cooling apparatus of claim 9, wherein said cooling means is selected from one of a blowing means, a Peltier element, a heat pipe and immersion in a liquid.

11. The cooling apparatus of claim 9, wherein said cooling means is a air blowing means which is disposed on a top face of a column of said heatsink against the heat receiving face.

12. The cooling apparatus of claim 9, wherein a sectional area in the longitudinal direction of the column decreases in one of tapering and step by step as a distance from said heat receiving face increases.

13. The cooling apparatus of claim 9, wherein a sectional area of the column of said heatsink decreases in one of tapering and step by step towards the ends of said heatsink.

14. The cooling apparatus of claim 9, wherein a width of said
   second slits is larger at ends than in a center of said heatsink.

15. The cooling apparatus of claim 9, wherein said cross-sectional width of the column decreases in a continuous manner.

16. The cooling apparatus of claim 9, wherein the length of said plurality of pillar-type protrusions increases as a vertical distance between said pillar-type protrusions and a surface of said heat receiving face increases.

17. The cooling apparatus of claim 9, wherein the length of said plurality of pillar-type protrusions increases as a vertical distance between said pillar-type protrusions and a surface of said heat receiving face increases.

* * * * *

UNITED STATES PATENT AND TRADEMARK OFFICE
CERTIFICATE OF CORRECTION

PATENT NO.   : 6,397,926 B1
DATED        : June 4, 2002
INVENTOR(S)  : Kaoru Sato et al.

It is certified that error appears in the above-identified patent and that said Letters Patent is hereby corrected as shown below:

<u>Column 12,</u>
Delete lines 18-21 and replace with

-- 17. The heatsink of claim 1, wherein surfaces of said pillar-type protrusions made of said first and second slits are treated to become alumina. --

Signed and Sealed this

Sixteenth Day of September, 2003

JAMES E. ROGAN
*Director of the United States Patent and Trademark Office*